(12) United States Patent
Lenhard

(10) Patent No.: US 6,218,825 B1
(45) Date of Patent: Apr. 17, 2001

(54) CURRENT SENSOR WITH SELF-OSCILLATING GENERATOR CIRCUIT

(75) Inventor: Friedrich Lenhard, Hanau (DE)

(73) Assignee: Vacuumschmelze GmbH, Hanau (DE)

( * ) Notice: Subject to any disclaimer, the term of this patent is extended or adjusted under 35 U.S.C. 154(b) by 0 days.

(21) Appl. No.: 09/355,577

(22) PCT Filed: Feb. 11, 1998

(86) PCT No.: PCT/DE98/00381

§ 371 Date: Jul. 30, 1999

§ 102(e) Date: Jul. 30, 1999

(87) PCT Pub. No.: WO98/36283

PCT Pub. Date: Aug. 20, 1998

(30) Foreign Application Priority Data

Feb. 14, 1997 (DE) .............................. 197 05 770

(51) Int. Cl.$^7$ ............................................. G01R 33/00
(52) U.S. Cl. ......................................................... 324/117 R
(58) Field of Search ............................... 324/117 R, 127

(56) References Cited

U.S. PATENT DOCUMENTS 5,568,047 * 10/1996 Staver et al. ..................... 324/117 R

FOREIGN PATENT DOCUMENTS

| 2 300 802 | 7/1974 | (DE) . |
| 22 28 867 B2 | 4/1979 | (DE) . |
| 28 34 499 C2 | 8/1979 | (DE) . |
| 37 15 789 C2 | 12/1988 | (DE) . |
| 42 29 948 A1 | 3/1994 | (DE) . |
| 295 20 066 U1 | 2/1996 | (DE) . |

OTHER PUBLICATIONS

Patent Abstracts of Japan, vol. 10, No. 19 (p–423) dated Jan. 24, 1986 & JP 60–173475 dated Sep. 6, 1985, Mishima Kosan Co Ltd., S Kimisuke, Self–Oscillation Type Current Sensor, single page.

Patent Abstract of Japan, vol 10, No. 52, (p–432) dated Feb. 28, 1986 & JP 60–196678 dated Oct. 5, 1985, Mishima Kosan Co Ltd., S Kimisuke, Differential Self–Exciting Bridge Type Current Sensor, single page.

Patent Abstracts of Japan, vol. 10, No. 19 (P–423) dated Jan. 24, 1986 & JP 60–173476 dated Sep. 6, 1985, Mishima Kosan Co Ltd., S Kimisuke, Bridge Type Current Sensor, pp. 469–475.

* cited by examiner

Primary Examiner—Safet Metjahic
Assistant Examiner—J Kerveros
(74) Attorney, Agent, or Firm—Schiff Hardin & Waite

(57) ABSTRACT

Current sensor with a magnetic core (8) on which, besides a primary winding (9) in which the current to be measured (i) flows, at least one secondary winding (5) is wound, into which winding an alternating current that is generated by a generator circuit (1 to 7; 14 to 29) is fed, said current saturating the magnetic core (8) in alternating fashion in at least one direction, whereby the generator circuit is self-running, whereby the polarity of the alternating current generated by the generator circuit (1 to 7; 14 to 29) alternates depending on the current flowing in the secondary winding (5) and on at least one threshold value for this current.

9 Claims, 2 Drawing Sheets

CURRENT SENSOR WITH SELF-OSCILLATING GENERATOR CIRCUIT

The invention relates to a current sensor with a magnetic core on which, in addition to a primary winding in which the current to be measured flows, at least one secondary winding is wound, into which winding an alternating current that is generated by a generator circuit is fed, which current saturates the magnetic core in alternating fashion in at least one direction.

German reference 42 29 948 A1 describes a current sensor in which a softly magnetic core is provided with primary and secondary windings. In series with the secondary winding, an additional current source is connected which sends a magnetizing current through the secondary winding, which current controls the softly magnetic core into positive, or respectively, negative saturation in alternating fashion. The softly magnetic core has an essentially rectangular magnetization characteristic, so that a respectively constant current flows between two saturation states during the reversal of magnetization, since, as a result of the nearly perpendicular curve of the magnetization characteristic, the inductive resistance tends to infinity. This current differs from an average value in the positive, or respectively, negative half-wave by a value which is defined by the hysteresis of the magnetization curve. By the formation of average values of the constant current flowing during the reversal of magnetization given two consecutive half-waves with different polarities, the influence of the hysteresis in the magnetization loop can be compensated, so that the measuring of the current in the secondary winding flowing during the magnetic reversal time yields a current that is directly proportional to the current in the primary winding, which is to be measured. To achieve a certain level of precision, however, a relatively high wiring outlay is necessary.

SUMMARY OF THE INVENTION

It is thus the object of the invention to provide a current sensor which offers a lower outlay given the same degree of precision, or respectively, offers a higher precision given the same outlay.

The object is inventively achieved by a current sensor of the abovementioned type in that the generator circuit for generating the alternating current is free-running. The polarity of the alternating current that is generated by the generator circuit is a function of the current flowing in the secondary winding and at least one threshold value for this current change. The non-linearity of the characteristic of the magnetic core material is electronically exploited in that switching threshold values are defined which electronically change the polarity of the alternating current. The loop shape, the value of the saturation, and to a certain extent the hysteresis of the magnetic core material, also, are only of secondary importance.

In a preferred embodiment of an inventive current sensor, it is provided that the generator circuit comprises a serial circuit of two inverting amplifiers (e.g. inverters, logic gates, inverting switching amplifiers, comparators, etc.), whereby the secondary winding is connected between input and output of one amplifier, and the input of this one amplifier is additionally coupled with the output of the other amplifier via a first resistor. A pulsewidth-modulated output signal stands ready at the outputs of both amplifiers and can be respectively tapped there. In this embodiment, the secondary winding is driven with a rectangular voltage which is changed over whenever the current through the secondary winding exceeds a defined value. The characteristic is offset according to the size of the current to be measured. Consequently, positive and negative half-waves are no longer the same size. However the pulsewidth ratio of the output signal varies, which can be evaluated as a signal mean value.

In another preferred embodiment, the generator circuit is constructed such that a second resistor is connected between a first node point and a first terminal of the secondary winding, and a third resistor is connected between a second node point and a second terminal of the secondary winding. The second terminal of the secondary winding is connected to an input of a first NAND gate directly and to an input of an NOR gate given the insertion of a first inverter. A second input of the first NAND gate and a second input of the NOR gate are connected to the second node point. Furthermore, an input of a second NAND gate is connected to the first terminal of the first secondary winding, and its second input is connected to the output of the first NAND gate. Finally, the outputs of the NOR gate and the first NAND gate are connected across the inputs of an AND gate whose output that carries the pulsemodulated output signal is connected to the second node point directly and to the first node point given the insertion of a second inverter. In this embodiment, only one of the two switching edges is exploited, thereby advantageously avoiding a large offset, which arises by virtue of the different switching levels at positive and negative switching edges.

It can also be provided that a freewheeling diode is respectively provided between the first node point and the first terminal of the secondary winding and between the second node point and the second terminal of the secondary winding.

In a development of the invention, a capacitor is respectively connected in series to first and second resistors. The secondary winding is thus driven with an approximately saw-toothed voltage instead of a rectangular voltage, thereby increasing the sensitivity of the sensor characteristic.

A low pass is preferably connected to the second input of the first NAND gate. Furthermore, the first input of the second NAND gate can be coupled with the first terminal of the secondary winding via a fourth resistor, with the first node point via a fifth resistor, and with a supply potential via a clamping diode. Accordingly, the input of the first inverter and the first input of the first NAND gate can be coupled with the second terminal of the secondary winding via a sixth resistor, with the second node point via a seventh resistor, and with the supply potential via another clamping diode.

It can also be provided that the magnetic core additionally comprises a compensation winding which is driven, by an evaluation circuit, with a compensation current which is derived on its part from a signal of the secondary winding. The evaluation circuit preferably contains a bridge amplification circuit which is driven by a pulsewidth-modulated signal. Due to the bridge amplification circuit, an operation is guaranteed given small unipolar supply voltages, and a very slight power loss arises due to the cycled operation of the bridge amplification circuit by means of the pulsewidth-modulated signal.

Finally, in an embodiment which involves very little outlay, the secondary winding is connected in series to a resistor situated between the input and output of a Schmitt trigger.

In the inventive current sensor, given driving with a rectangular current, it is also possible to evaluate the arising voltage impulses or the current during the voltage maximum at the coils.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
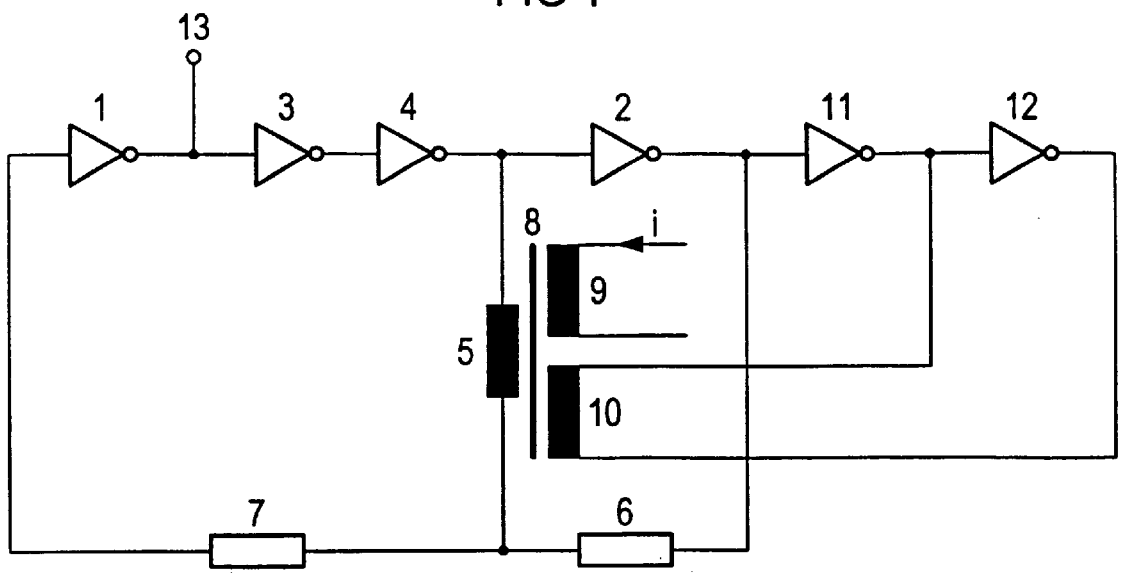
FIG. 1 depicts a first exemplifying embodiment.

In the exemplifying embodiment according to FIG. 1, two inverting amplifiers 1, 2 with very high amplification (such as comparators, logic inverters, switching amplifiers, Schmitt triggers, etc.) are connected in series. To further improve the switching behavior of the amplifier 1, two additional amplifiers 3 and 4 are connected to it downstream, so that following the amplifier 1 there are the amplifier 3, the amplifier 4, and lastly the amplifier 2. At the node point of amplifier 4 and amplifier 2, a terminal of a secondary winding 5 is connected, whose other terminal is connected to the output of the amplifier 2 via a resistor 6 and to the input of the amplifier 1 via a resistor 7. The secondary winding 5 is wound on a softly magnetic core 8 on which a primary coil 9, which is passed by a current i that is to be measured, is also placed.

Due to their high amplification, the amplifiers 1 to 2 act as comparators and thus comprise a defined switching threshold above which they carry a defined first signal level at the output and below which they make a defined second signal level available at the output. The output of the amplifier 1 carries the first or second signal level, depending on the strength of the current flowing in the secondary winding 5. This signal level is inverted by the succeeding amplifiers 3 and 4, and the steepness of the changeover edges is respectively increased. The resistor 7 serves here for input current limitation for the amplifier 1. Thus, the first signal level occurs at one terminal of the secondary winding 5, and due to the inversion by the amplifier 2, the second signal level is provided. The resistor 6 provides for output current limitation of the amplifier 2. When the current in the secondary winding 5 reaches a defined value, then the amplifier 1 tips, in turn, and the level relations at the secondary winding 5 reverse themselves.

In a development of the invention, a compensation winding 10 is also wound on the magnetic core 8, one terminal of which winding is connected to the output of an inverting amplifier 11, and the other output of which is connected to the output of an inverting amplifier 12. The input of the amplifier 12 is connected to the output of the amplifier 11, whose input is in turn connected to the output of the amplifier 2. At the outputs of the amplifiers 1 to 4, pulsewidth-modulated signals are respectively available, the pulsewidth ratio of which is proportional to the current i to be measured. In the present exemplifying embodiment, the output of the amplifier 1 is provided as output of the overall current sensor, while the output of the inverter 2 serves to drive the two amplifiers 11 and 12 in a bridge circuit.

Figure 2:
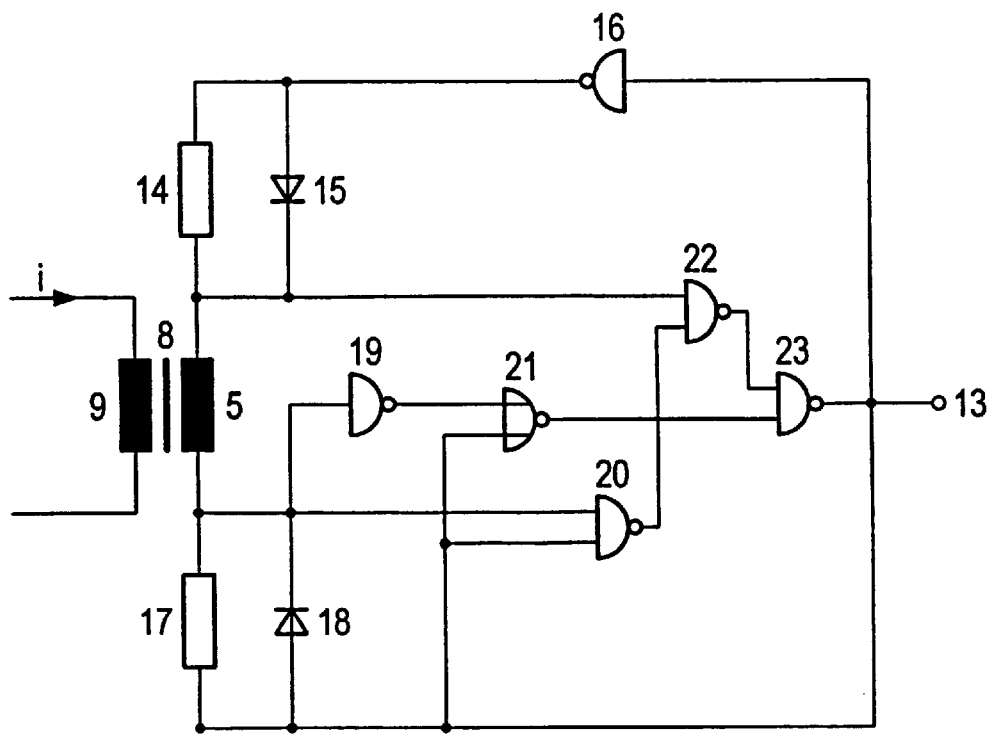
FIG. 2 depicts a second exemplifying embodiment.

In the exemplifying embodiment according to FIG. 2, a terminal of the secondary winding 5 is connected at the output of an inverter 16 via a resistor 14, to which a freewheeling diode 15 is connected in parallel. The input of the inverter is connected to the output 13 of the current sensor circuit. The other terminal of the secondary winding 5 is directly connected to the output 13 via a resistor 17. A freewheeling diode 18 is connected in parallel to the resistor 17. The second terminal of the secondary winding 5 is additionally connected to the input of an inverter 19, and to an input of a NAND gate 20. On its part, the output of the inverter 19 is coupled with an input of a NOR gate 21. The respective other input of the NOR gate 21 and the other input of the NAND gate 20 are connected to the output 13. Furthermore, a NAND gate 22 is provided whose one input is connected to the first terminal of the secondary winding 5 and whose other input is connected to the output of the NAND gate 20. The outputs of the NAND gate 22 and of the NOR gate 21 are conducted to the inputs of an AND gate 23, whose output forms the output 13 of the sensor circuit.

Figure 3:
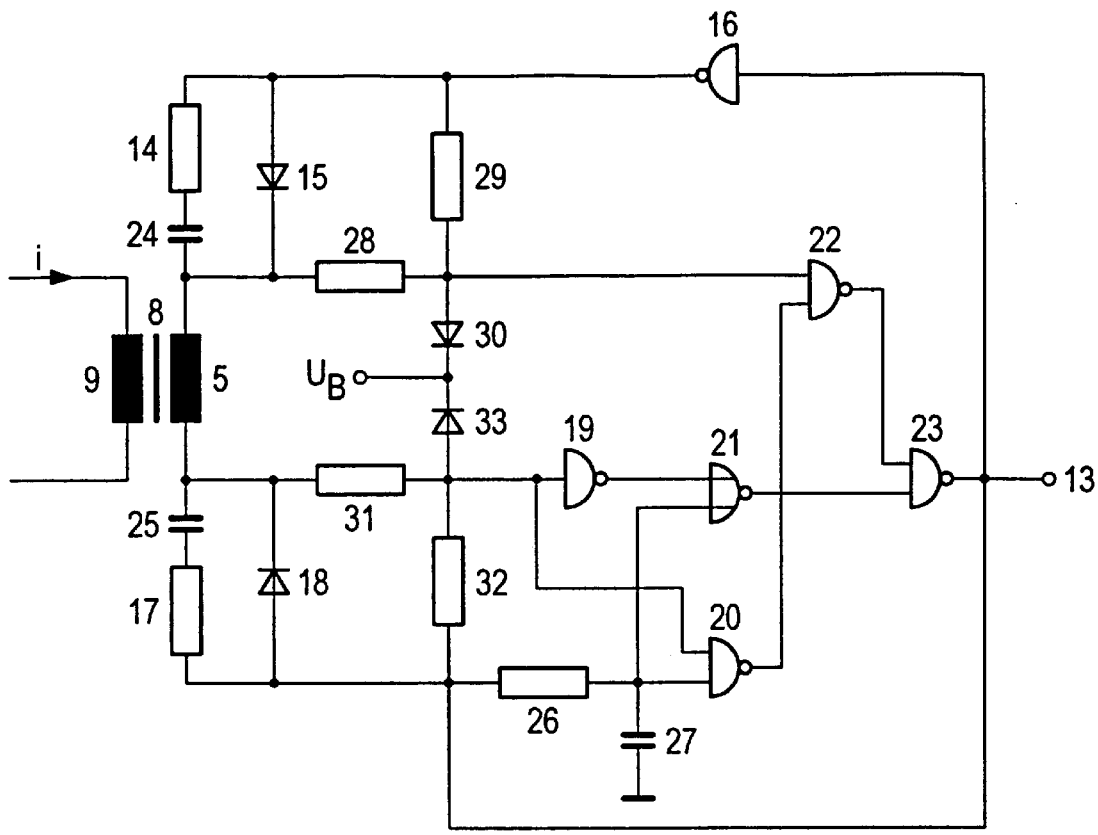
FIG. 3 depicts a third exemplifying embodiment.

The exemplifying embodiment according to FIG. 3 is modified in comparison to the exemplifying embodiment according to FIG. 2 to the effect that a capacitor 24, or respectively, 25 is respectively connected to the resistors 14 and 17 in series. Beyond this, a low pass consisting of the serially connected resistor 26 and the crossconnected capacitor 27, which leads to ground, is connected to the second input of the NAND gate 20 upstream. Between the first terminal of the secondary winding 5 and the first input of the NAND gate 22, a resistor 28 is connected, whereby the node point of resistor 28 and NAND gate 22 is connected to the output of the inverter 16 via a resistor 29, on one hand, and to a supply potential $U_B$ via a clamping diode 30, on the other hand. In a similar manner, the input of the inverter 19 and the first input of the NAND gate 20 are connected to the second terminal of the secondary winding 5 via a resistor 31, to the second node point via a resistor 32, and to the supply potential $U_B$ via a clamping diode 33.

Figure 4:
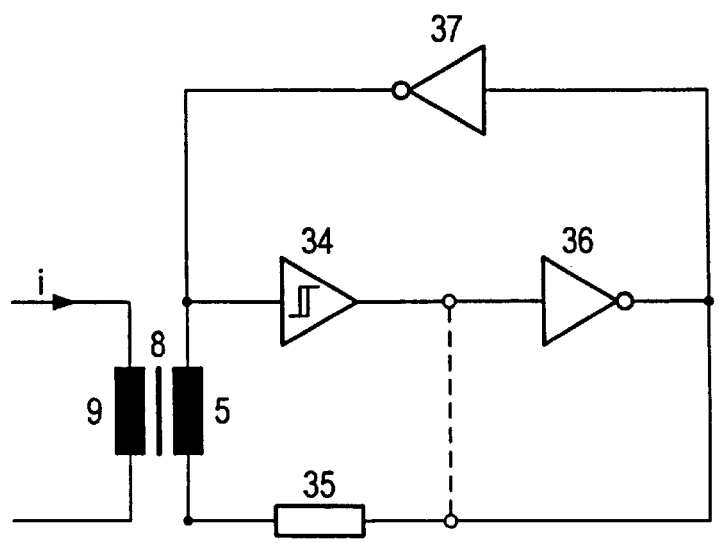
FIG. 4 depicts a fourth exemplifying embodiment of an inventive current sensor.

In the embodiment depicted in FIG. 4, the generator circuit consists in the simplest case of a Schmitt trigger, whereby one terminal of the secondary winding 5 is connected to the input of the Schmitt trigger 34, and the other terminal is coupled with the output of the Schmitt trigger via a resistor 35. This simple form, which is illustrated in the drawing as a dashed connection, is provided for the operation with bipolar voltage supply. If, on the other hand, only a unipolar voltage supply is available, it is provided that two amplifiers, e.g. two inverting switching amplifiers 36 and 37 in series, be connected to the Schmitt trigger 34 downstream. The output of the Schmitt trigger 34 is thus connected to the input of the switching amplifier 36, whose output is coupled with the input of the switching amplifier 37, on one hand, and with the second terminal of the secondary coil 5 via the resistor 35, on the other hand. The output of the switching amplifier 37 is connected to the first terminal of the secondary winding 5 and thus also to the input of the Schmitt trigger 34.

It is an advantage of the invention that the realization of a current sensor is possible for currents in the mA-range up to the 100-A-range which operates according to the compensation principle, but which makes do with only one combined sensor and compensation winding. Different types of driving can be used for the magnetic field detector. In a similar manner, drives of the magnetic field detector for compensation current sensors can be realized for currents in the mA-range up to the 1000-A-range given divided cores and windings for magnetic field detector and compensation winding. Finally, embodiments are possible wherein, with the aid of different drives of the magnetic field detector in compensation sensors for currents in the mA-range up to the 100-A-range, a common core and separate windings are used for magnetic field detector and compensation winding.

The magnetic field detector consists of a wound toroidal core or a closed core of arbitrary shape with a very small air gap or with none at all, and with a very small cross-section. But the toroidal core also be constructed open and can first be closed for measuring via a conductor (clothespin principle). The winding can occur partially. For example, one or more layered windings can be applied, and then a core consisting of ductile, amorphous, softly magnetic tape or wire can be wound in. The inventive current sensors are preferably employed in compensation current sensors such as are described in the European Patent Application EP 0 294 590.

To detect the magnetic field, the particular shape of the magnetization loop of the softly magnetic core is exploited, as well as the fact that this loop is offset linearly with the current in the conductor, which is surrounded by the softly magnetic core. To drive the sensor element (e.g. secondary winding), the softly magnetic core is charged with an alternating modulation, which can also occur cyclically by impulses. This modulation occurs by means of a sensor current in the winding. Due to the non-linear characteristic of the magnetic material, the symmetry can be interrogated and it can thus be established whether or not the magnetic core is magnetized. Given a deviation from the magnetic zero point, a compensation current is generated, which brings the core back to the zero point. Care must be taken, by means of corresponding filters, to assure that the sensor interrogation is not superimposed on the output signal, which is equal to the compensation current. The loop shape, the value of the saturation, and, to a limited extent, the hysteresis of the magnetic substance as well are only of secondary importance.

Besides the free-running sensor principle, principles with alternating modulation by means of externally triggered generators are also possible. Given a drive frequency which is strictly prescribed by a generator with external triggering, it is possible to drive with alternating voltage (sine, rectangle or sawtooth) or with alternating current (sine or triangle). Depending on the application, low frequencies (quasi cycled) or individual impulses can also be utilized. For example, given alternating voltage driving, the sum of the positive and negative peak voltages could be evaluated. The peak voltage evaluation can occur either by means of a sample-and-hold circuit or by charging capacitors via diodes. Another evaluation possibility is the measuring of the current in the sensor winding during the reversal of magnetization, which must equal zero in the compensated case. Given a driving by means of alternating current, the control current during the reversal of magnetization is likewise evaluated. The time of the approximate zero crossing of the magnetization can thus be easily determined and evaluated on the basis of the arising voltage maximum at the sensor winding.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A current, comprising:
a magnetic core having a primary winding in which a current that is to be measured flows, and having at least one secondary winding;
an alternating current that is generated by a free-running generator circuit that is fed to the secondary winding, which current saturates the magnetic core in alternating fashion in at least one direction;
a polarity of the alternating current that is generated by the generator circuit varying as a function of current flowing in the secondary winding and as a function of at least one threshold value for this current;
the generator circuit having a series circuit of first and second inverting amplifiers, the secondary winding being connected between input and output of the first amplifier, and the input of the first amplifier also coupled with an output of the second amplifier via a first resistor, and a pulsewidth-modulated output signal, which corresponds to the current to be measured, being tappable at the output of at least one of the first and second amplifiers.

2. The current sensor according to claim 1, wherein in the generator circuit, a second resistor is connected between a first node point and a first terminal of the secondary winding, and a third resistor is connected between a second node point and a second terminal of the secondary winding, wherein the second terminal of the secondary winding is directly connected to a first input of the a first NAND gate and to a first input of a NOR gate via a first inverter, a second input of the first NAND gate and a second input of the NOR gate are respectively connected to the second node point, wherein a first input of a second NAND gate is connected to the first terminal of the secondary winding and a second input of the second NAND gate is connected to an output of the first NAND gate, and wherein an output of the NOR gate is connected to a first input of a third NAND gate, and an output of the first NAND gate is connected to a second input of the third NAND gate via an inverter, an output of the third NAND gate that carries the pulsewidth-modulated output signal is directly connected to the second node point and to the first node point via a second inverter.

3. The current sensor according to claim 2, a freewheeling diode is connected between the first node point and the first terminal of the secondary winding and a second freewheeling diode is connected between the second node point and the second terminal of the secondary winding.

4. The current sensor according to claim 3, wherein a first capacitor is connected in series with the first resistor and a second capacitor is connected in series with the second resistor.

5. The current sensor according to claim 3, wherein a low pass is connected between the second input of the first NAND gate and the second resistor.

6. The current sensor according to claim 3, wherein the first input of the second NAND gate is coupled with the first terminal of the secondary winding via a fourth resistor, with the first node point via a fifth resistor and with a supply potential via a first clamping diode, and wherein the input of the first inverter and the first input of the first NAND gate are coupled with the second terminal of the secondary winding via a sixth resistor, with the second node point via a seventh resistor, and with the supply potential via a second clamping diode.

7. The current sensor according to claim 1, wherein the secondary winding is connected in series to a seventh resistor situated between the input and output of a Schmitt trigger.

8. The current sensor according to claim 1, wherein the magnetic core has a compensation winding, which is driven by an evaluation circuit with a compensation current which is derived from a signal of the secondary winding.

9. The current sensor according to claim 8, wherein the evaluation circuit comprises a bridge amplification circuit.

* * * * *